United States Patent
Chen et al.

(10) Patent No.: US 10,170,310 B1
(45) Date of Patent: Jan. 1, 2019

(54) METHOD OF FORMING PATTERNED STRUCTURE

(71) Applicants: UNITED MICROELECTRONICS CORP., Hsin-Chu (TW); Fujian Jinhua Integrated Circuit Co., Ltd., Quanzhou, Fujian Province (CN)

(72) Inventors: Chieh-Te Chen, Kaohsiung (TW); Feng-Yi Chang, Tainan (TW); Fu-Che Lee, Taichung (TW); Yi-Wang Zhan, Taichung (TW)

(73) Assignees: UNITED MICROELECTRONICS CORP., Hsin-Chu (TW); Fujian Jinhua Integrated Circuit Co., Ltd., Quanzhou, Fujian Province (CN)

( * ) Notice: Subject to any disclaimer, the term of this patent is extended or adjusted under 35 U.S.C. 154(b) by 0 days.

(21) Appl. No.: 15/900,772

(22) Filed: Feb. 20, 2018

(51) Int. Cl.
*H01L 21/033* (2006.01)
*H01L 27/108* (2006.01)
*H01L 21/768* (2006.01)

(52) U.S. Cl.
CPC ...... *H01L 21/0338* (2013.01); *H01L 21/0332* (2013.01); *H01L 21/0335* (2013.01); *H01L 21/0337* (2013.01); *H01L 21/7687* (2013.01); *H01L 21/76816* (2013.01); *H01L 21/76843* (2013.01); *H01L 27/10855* (2013.01)

(58) Field of Classification Search
USPC .......................................................... 438/695
See application file for complete search history.

(56) References Cited

U.S. PATENT DOCUMENTS

| | | | |
|---|---|---|---|
| 6,184,151 B1 | 2/2001 | Adair | |
| 7,429,536 B2 | 9/2008 | Abatchev | |
| 7,776,750 B2 | 8/2010 | Kim | |
| 9,748,139 B1 * | 8/2017 | Liou | H01L 21/76897 |

* cited by examiner

*Primary Examiner* — Roberts P Culbert
(74) *Attorney, Agent, or Firm* — Winston Hsu

(57) ABSTRACT

A method of forming a patterned structure is provided in the present invention. A hard mask layer is formed on a material layer before a first etching process and a second etching process for forming a first opening and a second opening partially overlapping with each other in the hard mask layer. The hard mask layer having the first opening and the second opening is then used in a third etching process performed to the material layer. A fourth etching process is performed to the hard mask layer and a dielectric layer disposed under the material layer after the third etching process. The material of the hard mask layer is identical to the material of the dielectric layer, and the fourth etching process may be used to remove the hard mask layer and form a trench in the dielectric layer accordingly.

10 Claims, 10 Drawing Sheets

METHOD OF FORMING PATTERNED STRUCTURE

BACKGROUND OF THE INVENTION

1. Field of the Invention

The present invention relates to a method of forming a patterned structure, and more particularly, to a method of forming a patterned structure using multiple patterning photolithography.

2. Description of the Prior Art

Integrated circuit (IC) is constructed by devices and interconnections, which are formed by patterned feature in the substrate or different layers. In the fabrication of IC, photolithography has been an essential technique. The photolithography is configured to form designed patterns such as circuit layout patterns on one or more photomasks, and then to precisely transfer such patterns to a photoresist layer on a film by exposure and development steps. Subsequently, the complicated layout patterns are precisely transferred to a semiconductor chip.

With the miniaturization development in the semiconductor industry and the progress in semiconductor fabrication technology, the widely used conventional exposure techniques are gradually approaching their limits. Therefore, at present, the industry has also developed double exposure lithography technology or multiple exposure lithography technology to make more miniaturized semiconductor device structure. However, during the multiple exposure lithography process, some region on the subject and/or the material layer to be patterned will be treated by more than one exposure lithography process and some region will be treated by only one exposure lithography process. Therefore, the conditions (such as etching depths) between different regions will be different and problems such as bad uniformity may occur. Other semiconductor processes performed subsequently and/or the operation condition of the semiconductor device formed by the multiple exposure lithography process may be affected accordingly.

SUMMARY OF THE INVENTION

A method of forming a patterned structure is provided in the present invention. A hard mask layer is formed on a material layer before performing a multiple patterning photolithography process to the material layer, and the hard mask layer is patterned before performing an etching process to the material layer with the patterned hard mask layer as a mask for improving etching depth variations between some regions caused by the multiple photolithography process. Additionally, because the material of the hard mask layer is identical to the material of a dielectric layer under the material layer, the hard mask layer may be removed by an etching process performed to the dielectric layer, and the purpose of process simplification may be achieved accordingly.

According to an embodiment of the present invention, a method of forming a patterned structure is provided. The method of forming the patterned structure includes the following steps. Firstly, a dielectric layer and a material layer are formed sequentially on a substrate. A hard mask layer is formed on the material layer. The material of the hard mask layer is identical to the material of the dielectric layer. A first patterned mask is formed on the hard mask layer and a first etching process using the first patterned mask as a mask is performed for forming at least one first opening in the hard mask layer. The first opening exposes at least a part of the material layer. The first patterned mask is removed after the first etching process. A second patterned mask is formed on the hard mask layer and a second etching process using the second patterned mask as a mask is performed after the first etching process for forming at least one second opening in the hard mask layer. The second opening exposes at least a part of the material layer, and the second opening partially overlaps the first opening. A third etching process is performed to the material layer with the hard mask layer having the first opening and the second opening as a mask for removing the material layer exposed by the first opening and the second opening. A fourth etching process is performed to the dielectric layer and the hard mask layer after the third etching process for removing the hard mask layer and forming a trench in the dielectric layer.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 3-10 are schematic drawings illustrating a method of forming a patterned structure according to a second embodiment of the present invention, wherein FIG. 4 is a cross-sectional diagram taken along a line B-B' in FIG. 3, FIG. 5 is a schematic drawing in a step subsequent to FIG. 4, FIG. 6 is a schematic drawing in a step subsequent to FIG. 5, FIG. 7 is a cross-sectional diagram taken along a line C-C' in FIG. 6, FIG. 8 is a schematic drawing in a step subsequent to FIG. 7, FIG. 9 is a schematic drawing in a step subsequent to FIG. 8, and FIG. 10 is a schematic drawing in a step subsequent to FIG. 9.

DETAILED DESCRIPTION

Figure 1:
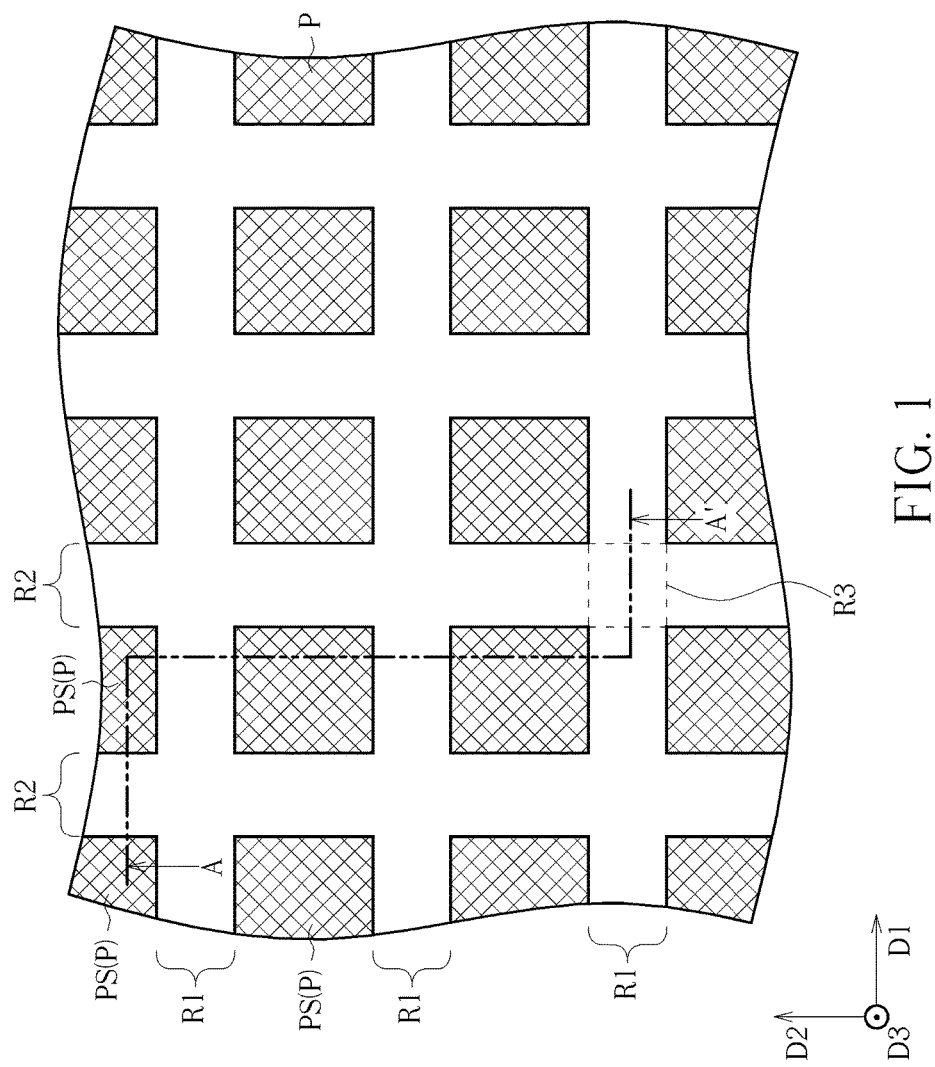
FIG. 1 is a schematic drawing illustrating a patterned structure according to a first embodiment of the present invention.
Figure 2:
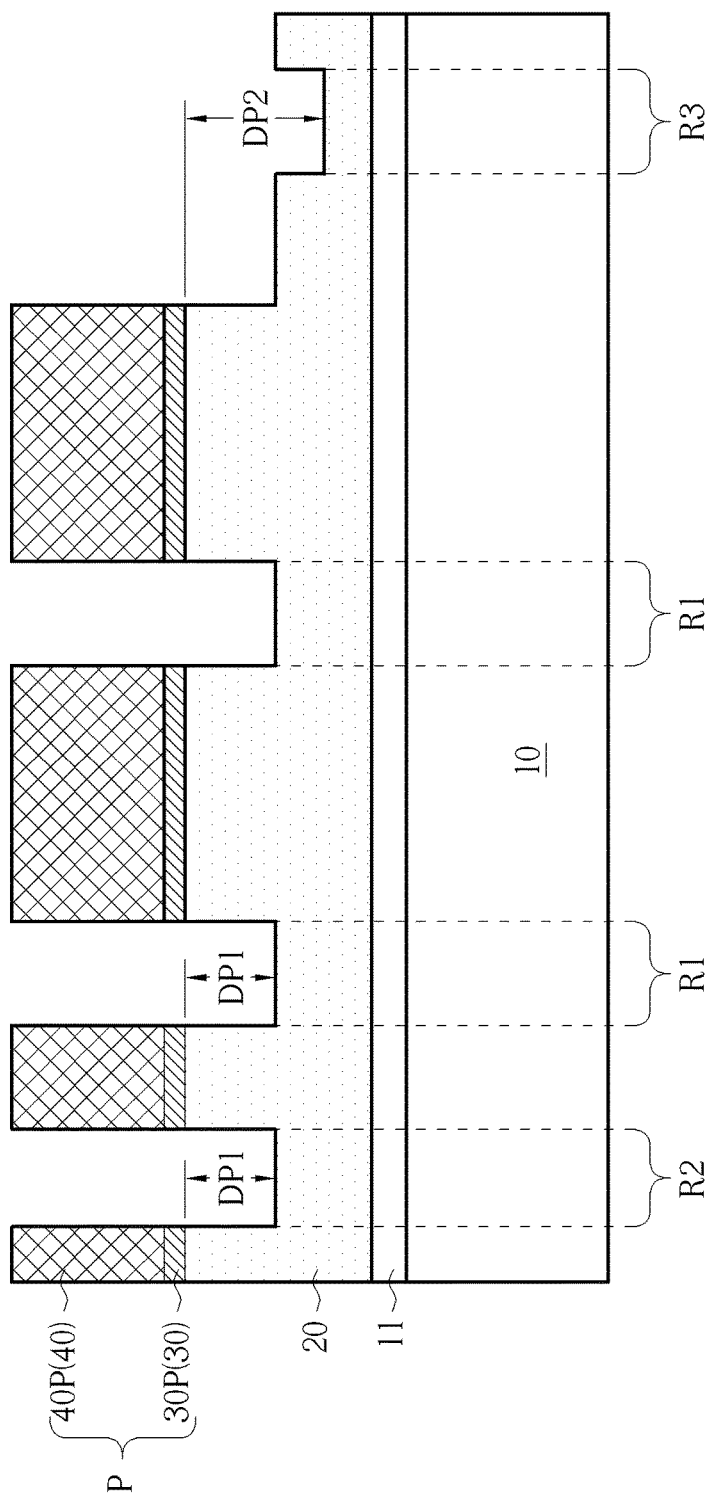
FIG. 2 is a cross-sectional diagram taken along a line A-A' in FIG. 1.

Please refer to FIG. 1 and FIG. 2. FIG. 1 is a schematic drawing illustrating a patterned structure according to a first embodiment of the present invention. FIG. 2 is a cross-sectional diagram taken along a line A-A' in FIG. 1. As shown in FIG. 1 and FIG. 2, a patterned structure P includes a patterned material layer 40P and a patterned barrier layer 30P under the patterned material layer 40P. The patterned material layer 40P may be formed by patterning a material layer 40, and the patterned barrier layer 30P may be formed by patterning a barrier layer 30. In some embodiments, the patterned material layer 40P may include a storage node pad structure of a memory device. Therefore, the material layer 40 may include metal conductive material such as tungsten (W), aluminum (Al), copper (Cu), or other suitable conductive materials, and the barrier layer 30 may include titanium (Ti), titanium nitride (TiN), tantalum nitride (TaN), or other suitable barrier materials, but not limited thereto. In some embodiments, the patterned structure P and the patterned material layer 40P may be other features in a semiconductor integrated circuit.

As shown in FIG. 1 and FIG. 2, the patterned structure P is aligned in a first direction D1 and a second direction D2 orthogonal to the first direction D1 and aligned in an array configuration. For forming the patterned structure P on a substrate 10, a dielectric layer 20, the barrier layer 30, and the material layer 40 may be formed sequentially on the substrate 10, and a photolithography process and an etching process may be performed to the barrier layer 30 and the material layer 40 for forming the patterned material layer 40P and the patterned barrier layer 30P. However, when the pattern of the patterned structure P is highly concentrated, the patterned structure P cannot be formed by only one photolithography process because of the process ability limitation of the photolithography process (such as the exposure process in the photolithography process), and a multiple patterning photolithography process is required to realize the pattern design of the patterned structure P. For instance, the spacing between sub patterns PS of the patterned structure P may be regarded as being composed of a plurality of first regions R1 elongated in the first direction D1 and a plurality of second regions R2 elongated in the second direction D2, and the first regions R1 cross the second regions R2. The area where the first regions R1 overlap the second regions R2 may be regarded as a third region R3. The material layer 40 and the barrier layer 30 in each of the first regions R1 may be patterned by one photolithography and etching process, and the material layer 40 and the barrier layer in each of the second regions R2 may be patterned by another one photolithography and etching process. However, the dielectric layer 20 will be etched also in the etching process performed to the barrier layer 30 and the material layer 40. The dielectric layer 20 in the third region R3 will be influenced by the etching process twice, and the etching depth of the dielectric layer 20 in the third region R3 (such as a second depth DP2 shown in FIG. 2) will be larger than the etching depth of the dielectric layer 20 in the first region R1 and the second region R2 (such as a first depth DP1 shown in FIG. 2). The depth variation of the dielectric layer 20 in different regions may influence other processes performed subsequently and/or the operation condition of the semiconductor device formed by this manufacturing method.

Figure 3:
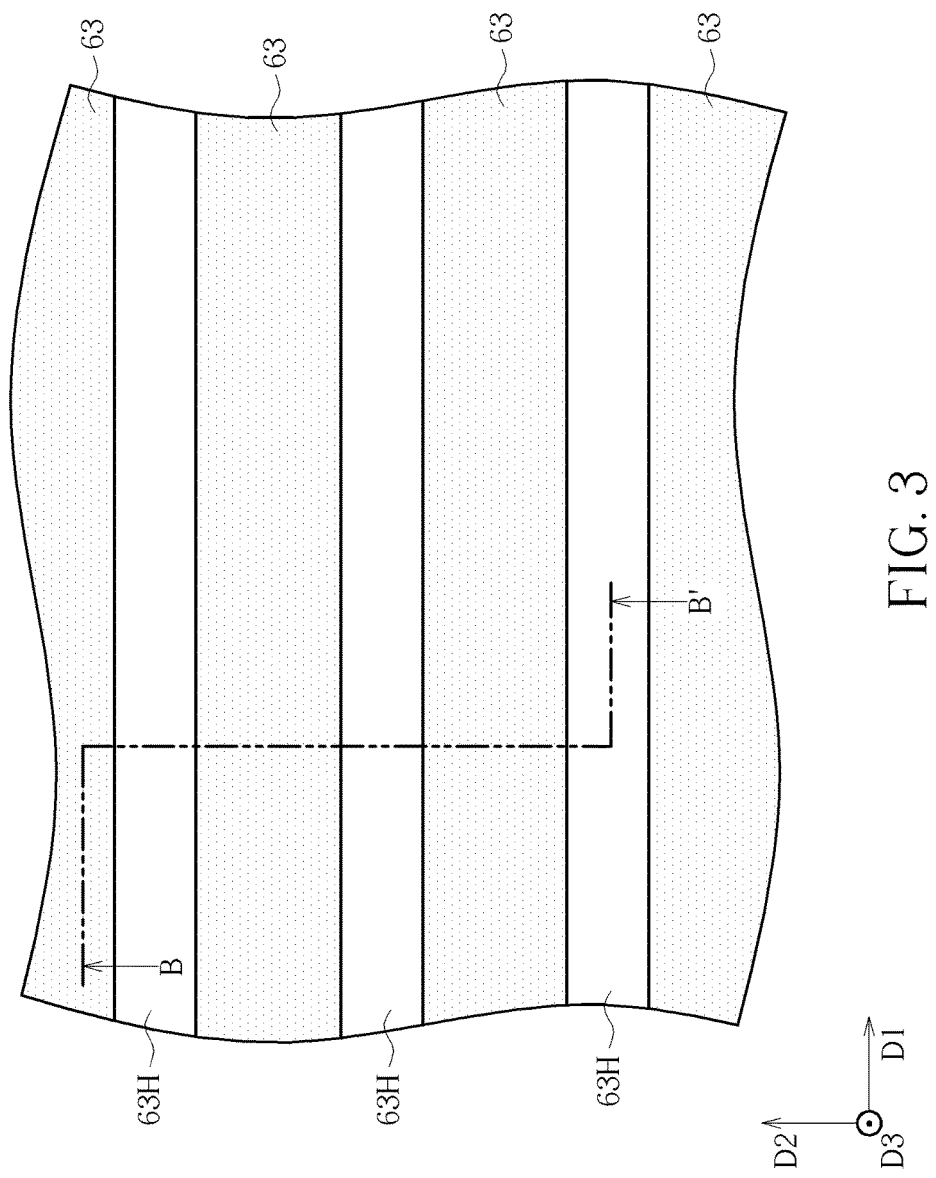
Figure 4:
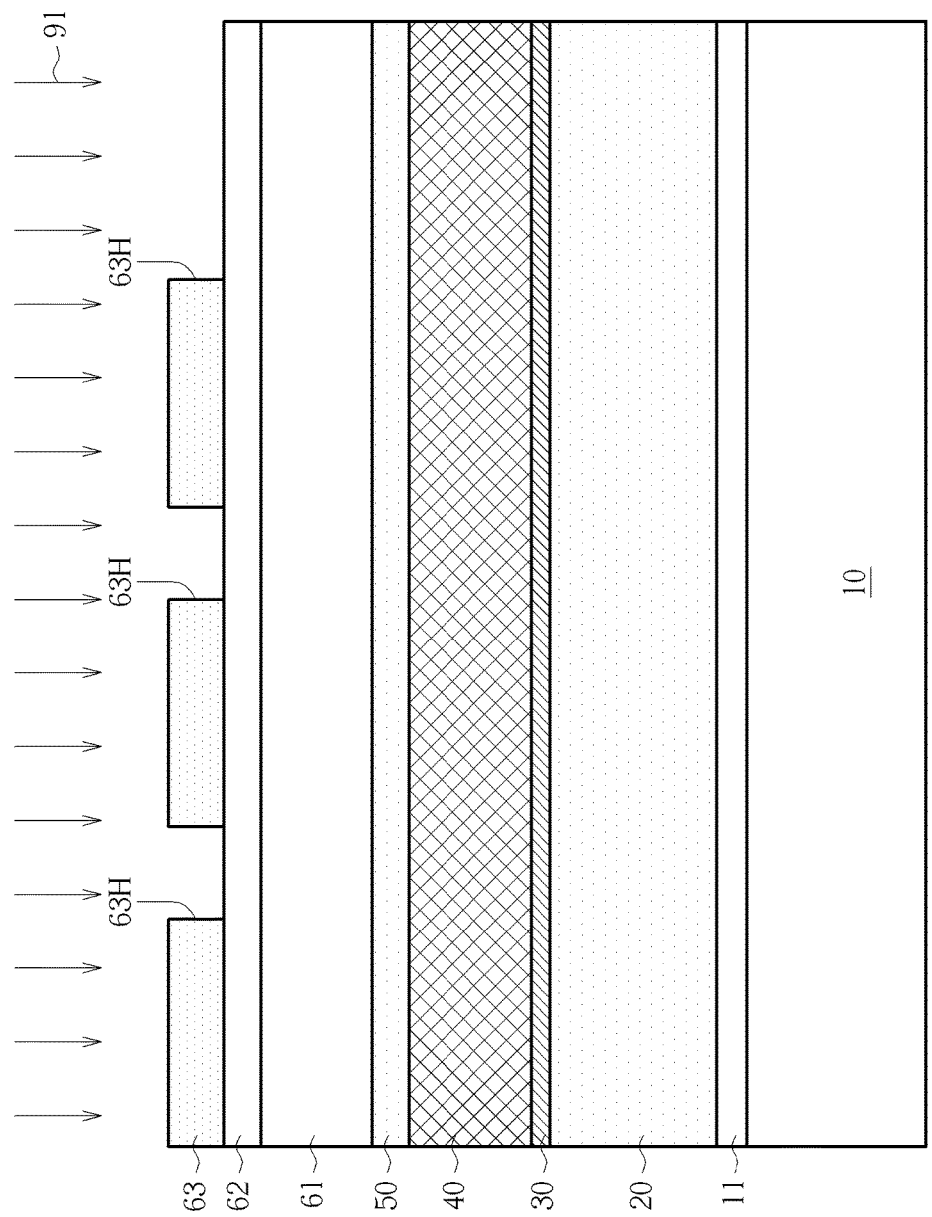

Please refer to FIG. 1 and FIGS. 3-10. FIGS. 3-10 are schematic drawings illustrating a method of forming a patterned structure according to a second embodiment of the present invention. The manufacturing method in this embodiment may be used to improve the problems in the first embodiment described above. A method of forming a patterned structure is provided in this embodiment and includes the following steps. Firstly, as shown in FIG. 3 and FIG. 4, the dielectric layer 20 and the material layer 40 are formed sequentially on the substrate 10, and a hard mask layer 50 is formed on the material layer 40. The material of the hard mask layer 50 is identical to the material of the dielectric layer 20. For example, the material of the hard mask layer 50 and the dielectric layer 20 may include silicon nitride or other suitable dielectric materials. Additionally, the substrate 10 may include a semiconductor substrate or a non-semiconductor substrate. The semiconductor substrate may include a silicon substrate, a silicon germanium substrate, or a silicon-on-insulator (SOI) substrate, and the non-semiconductor substrate may include a glass substrate, a plastic substrate or s ceramic substrate, but not limited thereto. For example, when the substrate 10 includes a semiconductor substrate, a plurality of memory cells and or semiconductor devices (not shown) may be formed on the semiconductor substrate first, or an oxide layer 11 may be formed on the substrate 10 before forming the dielectric layer 20, but not limited thereto. In addition, the barrier layer 30 may be formed between the material layer 40 and the dielectric layer 20 according to some considerations.

Subsequently, a first patterned mask 63 is formed on the hard mask layer 50 and a first etching process 91 using the first patterned mask 63 as a mask is performed. In some embodiments, a first organic distribution layer (ODL) 61 and a first anti-reflecting layer 62 (such as silicon-containing hard mask bottom anti-reflecting coating, SHB) may be sequentially formed on the hard mask layer 50 before the step of forming the first patterned mask 63, but not limited thereto.

Figure 5:
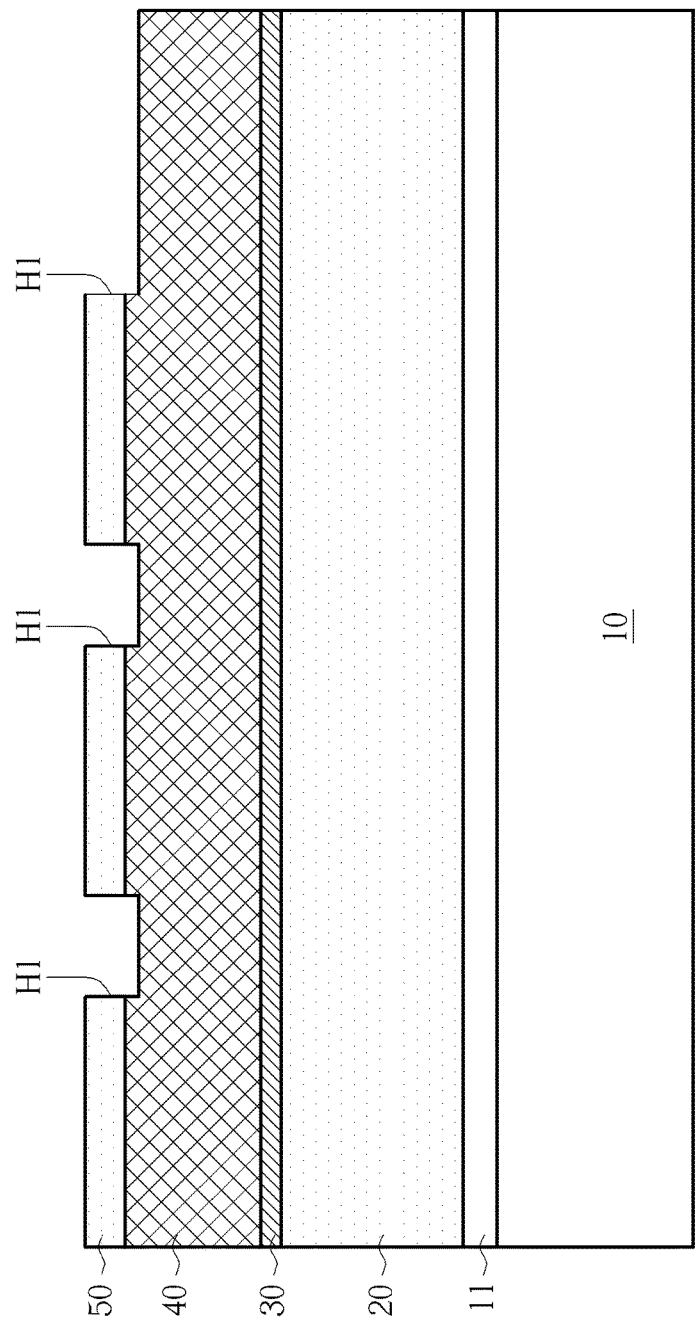

As shown in FIGS. 3-5, the first patterned mask 63 may include a plurality of first mask openings 63H, and each of the first mask openings 63H is elongated in the first direction D1. Therefore, at least one first opening H1 may be formed in the hard mask layer 50 by performing the first etching process 91 with the first patterned mask 63 as a mask. The first opening H1 exposes at least a part of the material layer 40, and the shape of the first opening H1 is formed corresponding to the shape of the first mask opening 63H in a vertical direction D3 substantially. Therefore, the first opening H1 is also elongated in the first direction D1. Additionally, in some embodiments, the material layer 40 exposed by the first opening H1 may be slightly etched by the first etching process 91 performed to the hard mask layer 50, but not limited thereto.

Figure 6:
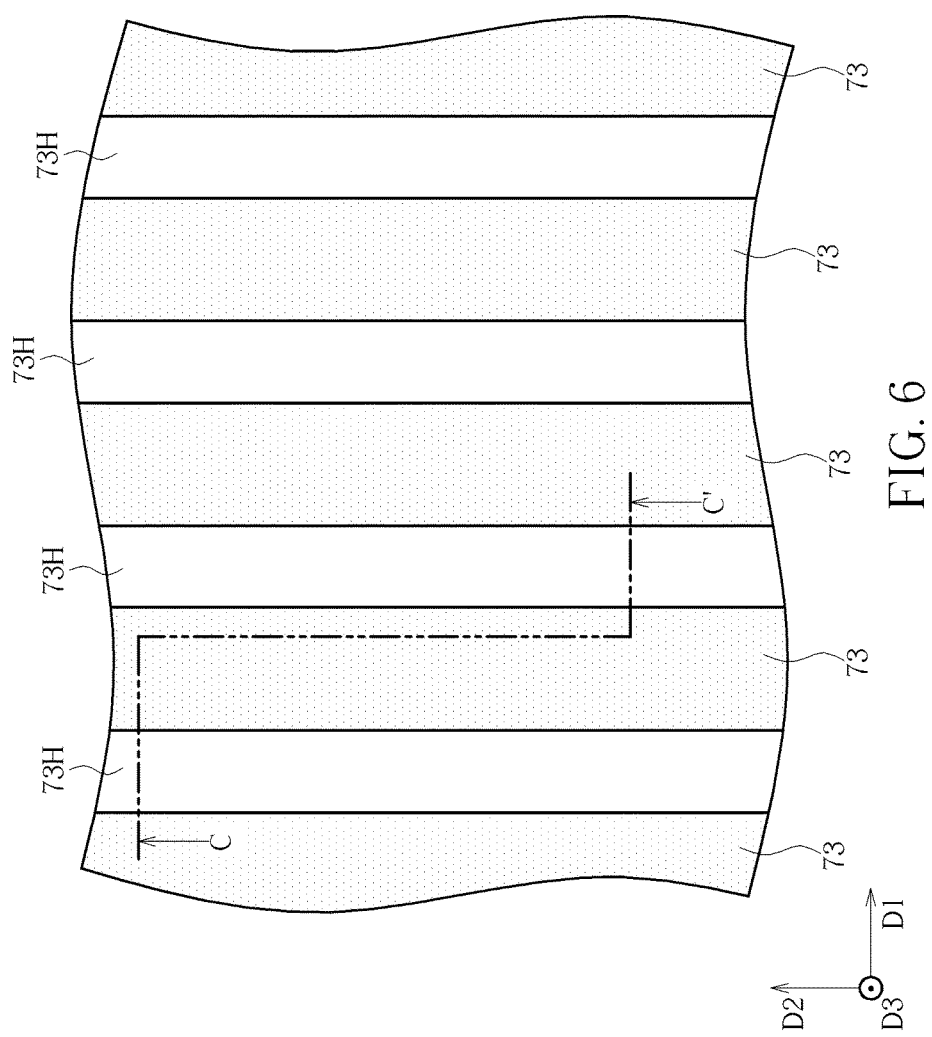
Figure 7:
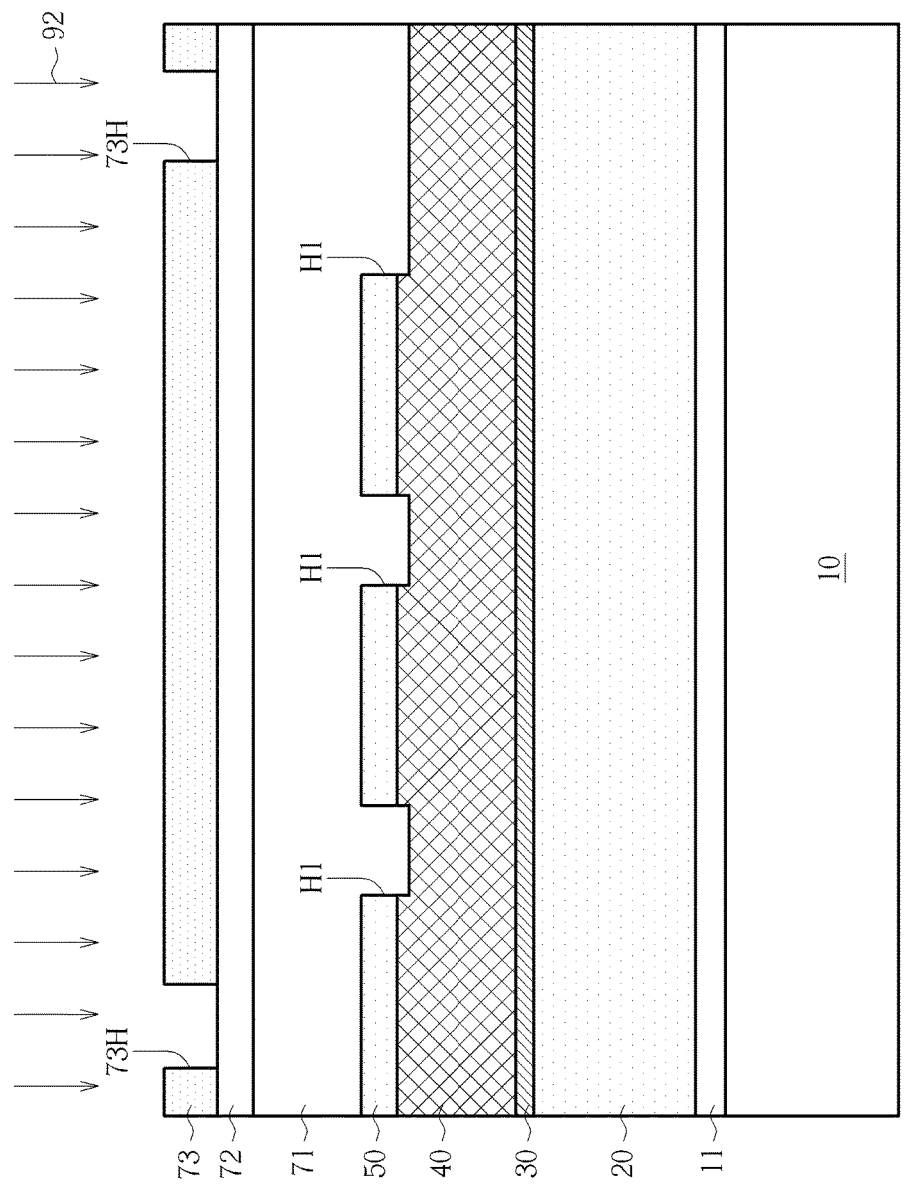
Figure 8:
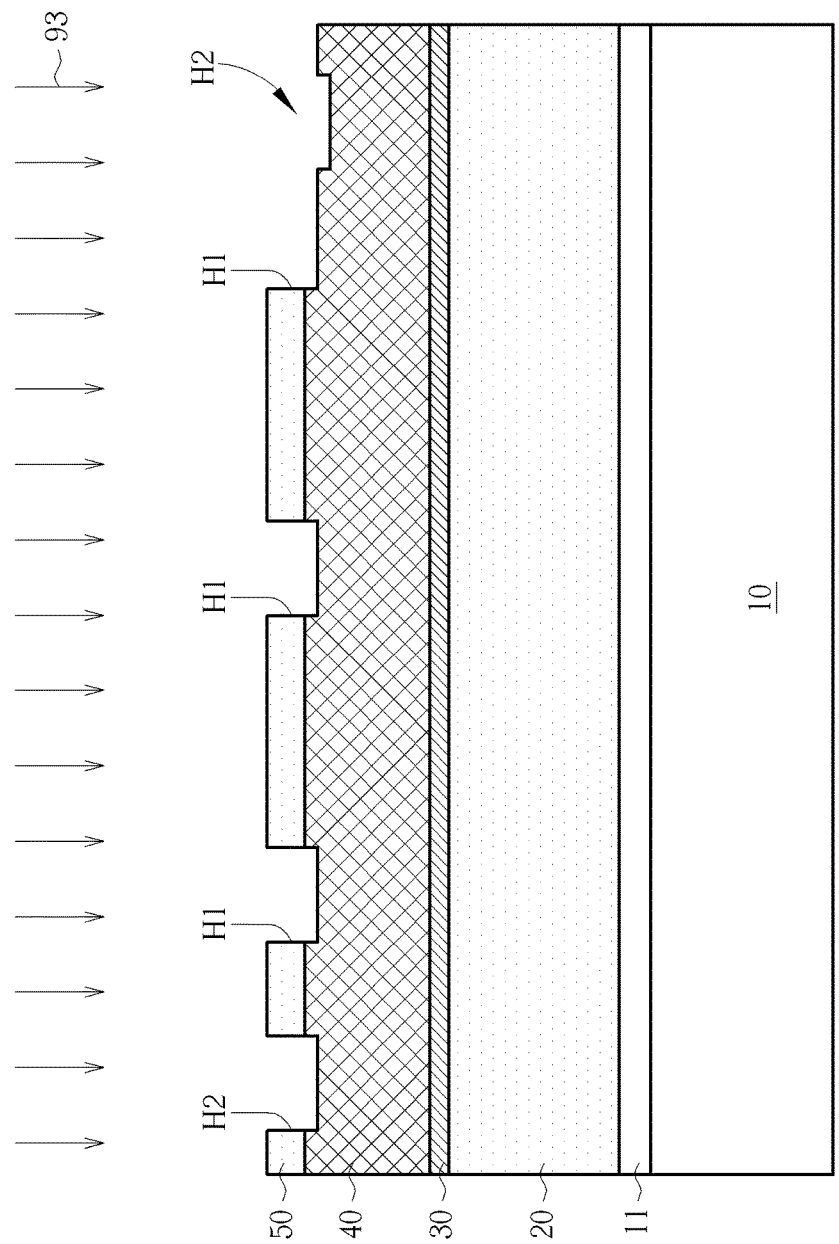

As shown in FIG. 4 an FIG. 5, after the first etching process 91, the first patterned mask 63, the first anti-reflecting layer 62, and the first organic distribution layer 61 are removed. As shown in FIGS. 6-8, a second patterned mask 73 is formed on the hard mask layer 50 which is etched by the first etching process, and a second etching process 92 using the second patterned mask 73 as a mask is performed after the first etching process. Similarly, in some embodiments, a second organic distribution layer 71 and a second anti-reflecting layer 72 may be sequentially formed on the hard mask layer 50 before the step of forming the second patterned mask 73, but not limited thereto. The second patterned mask 73 may include a plurality of second mask openings 73H, and each of the second mask openings 73H is elongated in the second direction D2. Therefore, at least one second opening H2 may be formed in the hard mask layer 50 by performing the second etching process 92 with the second patterned mask 73 as a mask. The second opening H2 exposes at least a part of the material layer 40, and the shape of the second opening H2 is formed corresponding to the shape of the second mask opening 73H in the vertical direction D3 substantially. Therefore, the second opening H2 is also elongated in the second direction D2, and the first opening H1 crosses and partially overlaps the second opening H2.

In some embodiments, the first etching process described above and the second etching process 92 may include anisotropic etching processes such as dry etching processes for better critical dimension (CD) controlling, but not limited thereto. Additionally, the material layer 40 exposed by the second opening H2 may be slightly etched by the second etching process 92 performed to the hard mask layer 50. In this situation, the material layer 40 located corresponding to the area where the first opening H1 overlaps the second opening H2 will be etched deeper than the material layer 40 on other regions, but the barrier layer 30 under the material layer 40 is not exposed. In other words, the barrier layer 30 is completely covered by the material layer 40 and is not exposed after the second etching process 92 and before a third etching process 93 going to be performed subsequently. Additionally, after the second etching process 92, the second patterned mask 73, the second anti-reflecting layer 72, and the second organic distribution layer 71 are removed.

Figure 9:
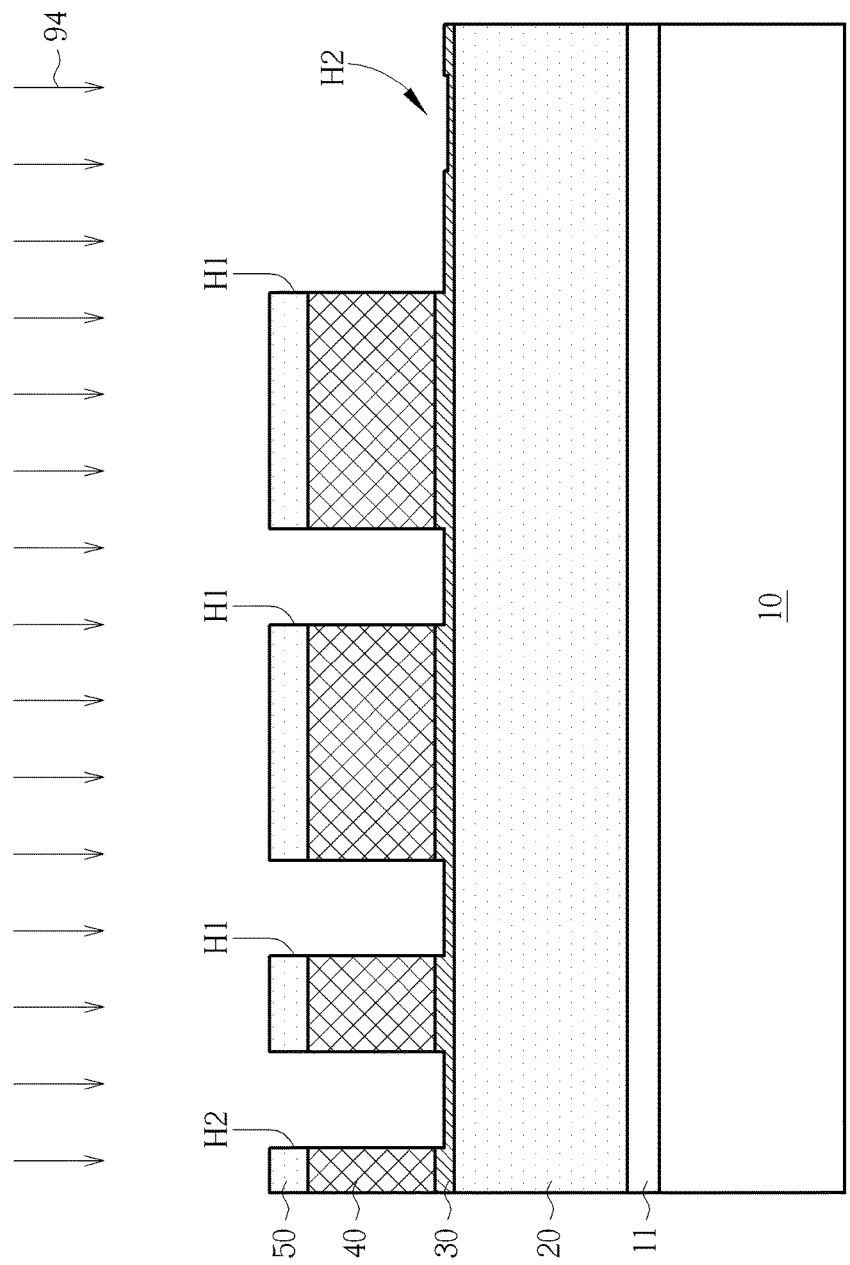

Subsequently, as shown in FIG. 8 and FIG. 9, a third etching process 93 is performed to the material layer 40 with the hard mask layer 50 having the first opening H1 and the second opening H2 as a mask for removing the material layer 40 exposed by the first opening H1 and the second opening H2. It is worth noting that the third etching process 93 has higher etching selectivity between the material layer 40 and the barrier layer 30, i.e., the etching rate of the material layer 40 in the third etching process 93 is much higher than the etching rate of the barrier layer 30 in the third etching process 93, and the third etching process 93 may be stopped at the barrier layer 30 without etching the dielectric layer 20 under the barrier layer 30. In other words, the dielectric layer 20 is covered by the barrier layer 30 without being exposed before and after the third etching process 93. Additionally, a part of the barrier layer 30 is exposed without being covered by the material layer 40 after the third etching process 93 for ensuring that the material layer 40 is effectively etched to have the required shape.

Figure 10:
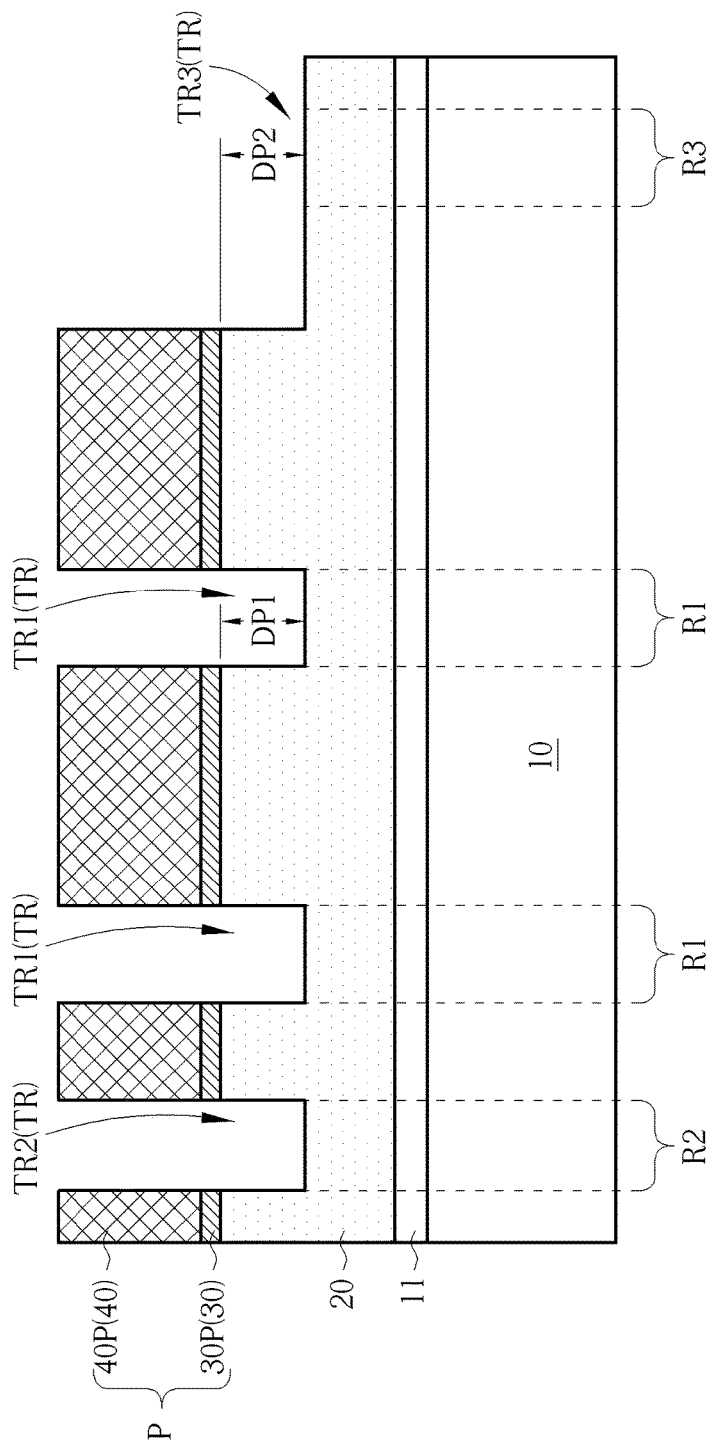

Subsequently, as shown in FIG. 9 and FIG. 10, a fourth etching process 94 is performed after the third etching process for removing the barrier layer 30 which is not covered by the material layer 40 and the hard mask layer 50. For ensuring that the part of the barrier layer 30 expected to be etched is effectively removed by the fourth etching process 94, a part of the dielectric layer 20 may also be etching by the fourth etching process 94, and a trench TR may be formed in the dielectric layer 20. Additionally, in this embodiment, the fourth etching process 94 may also be used to remove the hard mask layer 50, and the fourth etching process 94 may be regarded as an etching process performed to the barrier layer 30, the dielectric layer 20, and the hard mask layer 50. The fourth etching process 94 may have higher etching selectivity between the dielectric layer 20 and the material layer 40. In other words, the etching rate of the dielectric layer 20 and the hard mask layer 50 in the fourth etching process 94 should be higher than the etching rate of the material layer 40 in the fourth etching process 94 for avoiding over etching the material layer 40 after the hard mask layer 50 is removed by the fourth etching process 94. In some embodiments, the third etching process described above and the fourth etching process 94 may include anisotropic etching processes such as dry etching processes for better CD controlling, but not limited thereto. Additionally, because the material of the hard mask layer 50 is identical to the material of the dielectric layer 20, the fourth etching process 94 may be used to remove the hard mask layer 50 when removing a part of the barrier layer 30 and forming the trench TR in the dielectric layer 20, and the purpose of process simplification may be achieved accordingly.

As shown in FIGS. 8-10, after the third etching process 93 and the fourth etching process 94, the dielectric layer 20 is covered by the barrier layer 30 without being exposed, and the hard mask layer 50 still covers a part of the material layer 40. A part of the barrier layer 30 is exposed without being covered by the material layer 40 after the third etching process 93, and the exposed barrier layer 30 which is not covered by the material layer 40 is removed by the fourth etching process 94. The material layer 40 is patterned by the third etching process 93 and the fourth etching process 94 to become a patterned material layer 40P, and the barrier layer 30 is patterned by the third etching process 93 and the fourth etching process 94 to become a patterned barrier layer 30P. In some embodiments, the patterned material layer 40P may include a storage node pad structure of a memory device, but not limited thereto.

It is worth noting that after the third etching process 93 and before the fourth etching process 94, the etching depth of the barrier layer 30 located corresponding to the area where the first opening H1 overlaps the second opening H2 is deeper than the etching depth of the barrier layer 30 on other regions. The difference between the etching depth of the dielectric layer 20 located corresponding to the area where the first opening H1 overlaps the second opening H2 and the etching depth of the dielectric layer 20 on other region will not be obvious after the fourth etching process 94 by controlling the thickness of the barrier layer 30 to be smaller than the thickness of the material layer 40 and the thickness of the dielectric layer 20. For example, the thickness of the barrier layer 30 may be about 50 angstroms, the thickness of the material layer 40 may be about 500 angstroms, and the thickness of the dielectric layer 20 may be about 800 angstroms, but not limited thereto.

In other words, if a part of the substrate 10 located corresponding to the first opening H1 is defined as a first region R1, a part of the substrate 10 located corresponding to the second opening H2 is defined as a second region R2, and an overlapped region between the first region R1 and the second region R2 is defined as a third region, the trench TR is formed on the first region R1, the second region R2, and the third region R3, and a depth (such as a second depth DP2 shown in FIG. 10) of the trench TR on the third region R3 (such as a third trench TR3 shown in FIG. 10) is substantially equal to a depth (such as a first depth DP1 shown in FIG. 10) of the trench TR on the first region R1 apart from the third region R3 (such as a first trench TR1 shown in FIG. 10) or the trench TR on the second region R2 apart from the third region R3 (such as a second trench TR2 shown in FIG. 10). The depth of the trench TR formed in the dielectric layer 20 on the first region R1, the second region R2, and the third region R3 may be uniform by the method of forming the patterned structure in this embodiment. In addition, by controlling the thickness of the hard mask layer 50, the hard mask layer 50 may be thinner than the dielectric layer 20 after the third etching process 93 and before the fourth etching process 94 for ensuring that the hard mask layer 50 can be completely removed by the fourth etching process 94 and the trench TR does not penetrate trough the dielectric layer 20, and the process window of the fourth etching process 94 may be increased accordingly. Additionally, the depths of the trench in the dielectric layer 20 on different region are not different from one another obviously, and the influence of the depth variation on other processes performed subsequently and/or the operation condition of the semiconductor device formed by this manufacturing method may be avoided accordingly.

To summarize the about descriptions, according to the method of forming the patterned structure in the present invention, the hard mask layer is formed on the material layer before performing the multiple patterning photolithography process, and the hard mask layer is patterned before performing then etching process to the material layer with the patterned hard mask layer as a mask for improving the etching depth variations between some regions caused by the multiple photolithography process. Additionally, because the material of the hard mask layer is identical to the material of the dielectric layer under the material layer, and the hard mask layer may be removed by the etching process performed to the dielectric layer. The purpose of process simplification may be achieved accordingly.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of forming a patterned structure, comprising:
   forming a dielectric layer and a material layer on a substrate sequentially;
   forming a hard mask layer on the material layer, wherein the material of the hard mask layer is identical to the material of the dielectric layer;
   forming a first patterned mask on the hard mask layer and performing a first etching process using the first patterned mask as a mask for forming at least one first opening in the hard mask layer, wherein the first opening exposes at least a part of the material layer;
   removing the first patterned mask after the first etching process;
   forming a second patterned mask on the hard mask layer and performing a second etching process using the second patterned mask as a mask after the first etching process for forming at least one second opening in the hard mask layer, wherein the second opening exposes at least a part of the material layer, and the second opening partially overlaps the first opening;
   performing a third etching process to the material layer with the hard mask layer having the first opening and the second opening as a mask for removing the material layer exposed by the first opening and the second opening; and
   performing a fourth etching process to the dielectric layer and the hard mask layer after the third etching process for removing the hard mask layer and forming a trench in the dielectric layer.

2. The method of forming the patterned structure according to claim 1, further comprising:
   forming a barrier layer between the material layer and the dielectric layer, wherein the dielectric layer is covered by the barrier layer after the third etching process and before the fourth etching process.

3. The method of forming the patterned structure according to claim 2, wherein after the third etching process, a part of the barrier layer is exposed without being covered by the material layer, and the exposed barrier layer is removed by the fourth etching process.

4. The method of forming the patterned structure according to claim 2, wherein the barrier layer is completely covered by the material layer after the second etching process and before the third etching process.

5. The method of forming the patterned structure according to claim 1, wherein the hard mask layer covers a part of the material layer after the third etching process and before the fourth etching process.

6. The method of forming the patterned structure according to claim 1, wherein a part of the substrate located corresponding to the first opening is defined as a first region, a part of the substrate located corresponding to the second opening is defined as a second region, and an overlapped region between the first region and the second region is defined as a third region, wherein the trench is formed on the first region, the second region, and the third region, and a depth of the trench on the third region is equal to a depth of the trench on the first region apart from the third region or on the second region apart from the third region.

7. The method of forming the patterned structure according to claim 1, wherein the first opening is elongated in a first direction, the second opening is elongated in a second direction, and the first direction is orthogonal to the second direction.

8. The method of forming the patterned structure according to claim 1, wherein the material layer is patterned by the third etching process and the fourth etching process to become a patterned material layer, and the patterned material layer comprises a storage node pad structure of a memory device.

9. The method of forming the patterned structure according to claim 1, wherein the material of the hard mask layer and the dielectric layer comprises silicon nitride.

10. The method of forming the patterned structure according to claim 1, wherein the trench does not penetrate trough the dielectric layer.

* * * * *